PREPARATION OF MULTILAYER BOARDS FOR ELECTRICAL CONNECTIONS BETWEEN LAYERS

Filed July 1, 1963

INVENTORS
ROBERT J. MEDFORD
MONROE H. BESTER
BY
L. Lee Humphries
ATTORNEY

United States Patent Office 3,276,106
Patented Oct. 4, 1966

3,276,106

PREPARATION OF MULTILAYER BOARDS FOR ELECTRICAL CONNECTIONS BETWEEN LAYERS

Monroe H. Bester, Whittier, and Robert J. Medford, Los Angeles, Calif., assignors to North American Aviation, Inc.

Filed July 1, 1963, Ser. No. 291,748
1 Claim. (Cl. 29—155.5)

Figures 1, 2:
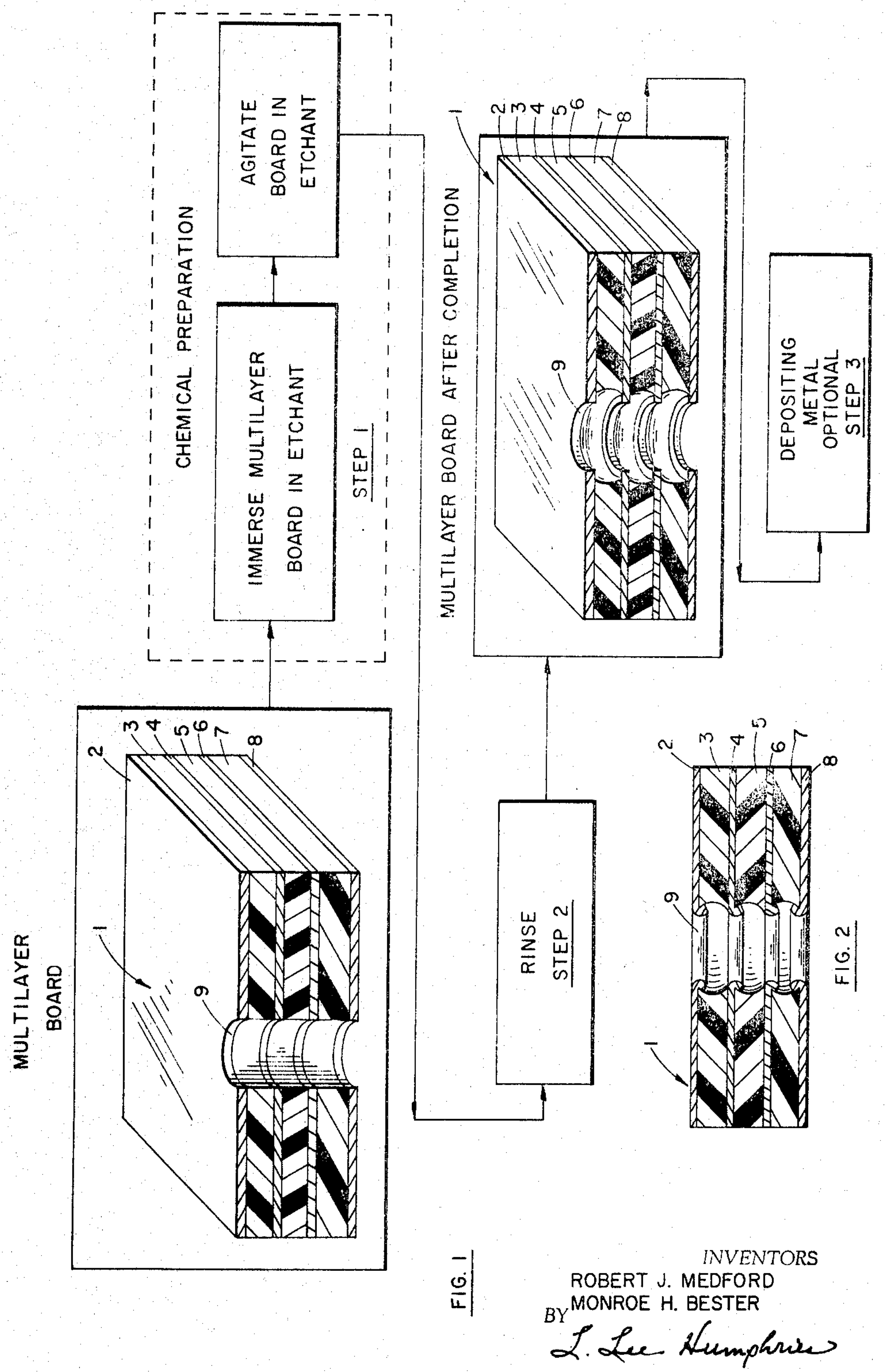

This invention relates to a process of manufacture for improving the reliability of interconnections in multilayer circuit boards and more specifically to a process of manufacture using a chemical etchant to expose additional interconnectable layer areas for improving reliability of interconnections in multilayer circuit boards.

Multilayer etched circuit boards with interconnections made by conventional drilling and electrolytic plating are increasingly being used in computer and other electronic art. The degree of reliability obtainable by making interconnections by the use of drilling and electrolytic plating often fails to meet the requirements necessary to achieve a high reliability system because of the high plating quality necessary and because of the limited interconnection area available for plating. In the process of drilling the hole and before the plating, epoxy or other contaminant matter is often smeared over the interconnecting foil layer so as to become an additional limitation in obtaining reliable connections. In this regard, reference may be had to copending application, Serial No. 291,749, entitled Smoothing of Mechanically Drilled Holes, which copending application is filed simultaneously herewith. This invention relates to a process for removing smeared contaminants from interconnectable foil layers and for exposing a greater area of the interconnectable layers. Additional exposed area facilitates deposition of a reliable metal connection between layers in subsequent production processes involving the board. This process is comprised of the steps of immersing a multilayer board having drilled holes therein into a heated fluosulfonic etchant for a predetermined length of time and rotating or otherwise agitating the boards therein at a predetermined rate until a sufficient area of copper cladding comprising the interconnectable foil layers is exposed. The board is afterwards rinsed to remove residue. The board is then ready for a deposition or plating process. An additional step may be added after the rinsing to press the overhanging copper foil exposed by the chemical etching step to the hole wall.

Therefore it is an object of this invention to provide a process for etching away the dielectric layers sandwiched between interconnectable foil to expose additional areas of the foil layers.

It is another object of this invention to provide a process for exposing additional areas of interconnectable circuitry for electrolytic plating.

It is still another object of this invention to provide a process for removing contaminants smeared over interconnectable foil layers of multilayer boards for improved electrolytic plating.

Still another object of this invention is to provide a process for improving the reliability of interconnections made between foil layers of a multilayer circuit board.

It is another object of this invention to provide a process for improving the bond strength of foil interconnectable layers of a multilayer laminate to electrolytically plated layers on the inside of drilled holes.

These and other objects of the invention will become apparent from the following description taken in connection with the accompanying drawings, in which FIG. 1 is a schematic diagram of the steps of the process for chemically exposing a sufficient area of an interconnectable metallic layer of a multilayer circuit board for effecting reliable electrolytic bonding, including a cross sectional view of the board as it passes through each step of the process; and FIG. 2 illustrates a cross sectional view of a multilayer board chemically etched and having overhang pressed to the hole wall.

Referring now to FIG. 1 wherein multilayer board 1 is passed through the steps of the process for exposing additional areas of the interconnectable foil layers of a multilayer board. A cross sectional view of multilayer laminate 1, having metallic foil layers 2, 4, 5, and 8 and dielectric layers 3, 5, and 7 is shown in FIG. 1 with a mechanically drilled hole 9 extending therethrough. Layers 2, 4, 6, and 8 are comprised of a metallic material such as gold, gold alloy, copper, copper alloy, etc., and may be more or less in number than four, and dielectric layers 3, 5, and 7 are comprised of an epoxy or other plastic type material as well as glass materials and also may be increased in number as the metal layers are increased. One dielectric layer is between two metal layers. In step one board 1 is dipped into a solution of chemical etchant, preferably two parts $H_2SO_4$ (having a concentration range of from 93% to 98% preferred) and one part HF (having a concentration range of from 70% to 100%, preferred 70%), heated preferably to 142° F.

Another preferred etchant is the composition comprising 38% to 40% $H_2SO_4$ (93%), 28% to 29% HF (70%), and 17% to 21% $HSO_3F$ (98.5%) heated within a range of 110° F. to 148° F. (preferred range 116° to 120° F.). This etchant reduces the formation of sulfones and other derivatives on hole multilayer surfaces.

The preferred etchants are acids used to etch away the dielectric layers separated by the metal layers. In a specific embodiment, the preferred etchants etch an epoxy glass dielectric material.

Board 1, while dipped in said etchant is horizontally agitated at a preferred rate of six feet per minute by means of a work rod, or at approximately 86 revolutions per minute if an air driven stirrer is used. Other means of agitation such as an ultrasonic agitator, air or spray agitator, etc., may be used successfully. Ultrasonic agitation at a rate of 20 to 25 kilocycles per second was found to be satisfactory for boards having hole diameters of approximately 0.052 inch for board thicknesses of approximately 0.0625 inch. Board 1 remains in the solution for approximately 15 to 120 seconds, with the preferred time being 30 seconds.

After the dielectric has been etched so that additional interconnectable area is available for plating in step one, it is removed from the solution and in step two rinsed in tap water by means such as water spray, ultrasonic cleaner, overflow running rinse, or immersion bath so that all residues are removed. The board is then ready for plating by known plating processes shown as optional step 3. The experimental data tabulated from a number of tests conducted with various etchants, different temperatures, and agitation rates show the scope of the invention.

EXPERIMENT ONE

The following tabulated data is taken in connection with experiments run on boards approximately .0625 inch thick having epoxy glass layers and having interconnecting foil layers of copper. Boards having thicknesses of 4 to 8 milli inches were also tested. Other materials such as various plastics, polyesters, and phenolics have also been tested successfully with the etchants. The time, speed of agitation and temperature are interrelated with the type of material being etched and with the degree of cure of that material. The etchant was contained in a 500 milliliter polyethylene beaker and was maintained at proper temperatures by means of a water bath.

*Table I.—Etchants used*

| Etchant | Concentration Percent by Weight | Solution Temperature Fahrenheit | Dielectric Materials Etched |
|---|---|---|---|
| 1. Sulfuric acid | 60.0 | 78 | Epoxy-glass. |
| Hydrofluoric Acid | 1.3 | | |
| Water | 38.7 | | |
| 2. Sulfuric Acid | 60.0 | 78 | Do. |
| Hydrofluoric Acid | 11.0 | | |
| Water | 29.0 | | |
| 3. Ammonium Persulfate | 10.0 | 78 | Do. |
| Hydrofluoric Acid | 36.0 | | |
| Water | 54.0 | | |
| 4. Ammonium Persulfate | 26.0 | 78 | Do. |
| Hydrofluoric Acid | 27.0 | | |
| Water | 47.0 | | |
| 5. Acetone | 42.0 | 78 | Do. |
| Hydrofluoric Acid | 28.0 | | |
| Water | 30.0 | | |
| 6. Acetone | 42.0 | 78 | Do. |
| Acetic Acid | 36.0 | | |
| Hydrofluoric Acid | 11.0 | | |
| Water | 26.0 | | |
| 7. Acetone | 28.0 | 150 | Do. |
| Acetic Acid | 37.0 | | |
| Acetyl Acetone | 35.0 | | |
| 8. Hydrofluoric Acid | 11.0 | 78 | Do. |
| Acetyl Acetone | 24.0 | | |
| Potassium Iodide | 25.0 | | |
| Water | 40.0 | | |
| 9. Propylene Oxide | 100.0 | 78 | Do. |
| 10. Sodium Hydroxide | 20.0 | 78 | Do. |
| Lithium Carbonate | 20.0 | | |
| Water | 60.0 | | |
| 11. Sulfuric Acid | 48.0 | 78 | Do. |
| Propylene Oxide | 26.0 | | |
| Water | 59.0 | | |
| 12. Sulfuric Acid | 48.0 | 194 | Do. |
| Nitric Acid | 31.0 | | |
| Water | 21.0 | | |
| 13. Hydrochloric Acid | 38.0 | 78 | Do. |
| Water | 62.0 | | |
| 14. Hydrofluoric Acid | 37.0 | 78 | Do. |
| Water | 63.0 | | |
| 15. Hydrofluoric Acid | 17.5 | 135 | Do. |
| Sulfuric Acid | 40.0 | | |
| Nitric Acid | 23.0 | | |
| Water | 19.5 | | |
| 16. Sulfuric Acid | 95.0 | 78 | Do. |
| Water | 5.0 | | |
| 17. Nitric Acid | 69.7 | 78 | Do. |
| Water | 30.3 | | |
| 18. Sulfuric Acid | 95.0 | 160 | Do. |
| Water | 5.0 | | |
| 19. Nitric Acid | 69.7 | 130 | Do. |
| Water | 30.3 | | |
| 20. Fluoboric Acid | 21.0 | 150 | Do. |
| Sulfuric Acid | 54.0 | | |
| Water | 25.0 | | |
| 21. Hydrofluoric Acid | 26.0 | 78 | Do. |
| Sulfuric Acid | 60.0 | | |
| Water | 14.0 | | |
| 22. Hydrofluoric Acid | 16.0 | 75–142 | Do. |
| Sulfuric Acid | 73.0 | | |
| Water | 10.5 | | |
| 23. Sodium Hydroxide | 10–60 | 80–190 | Polyester. |
| 24. Sulfuric Acid ($H_2SO_4$) | 30–45 | 110–148 | Epoxy-glass. |
| Hydrofluoric (HF) | 25–31 | | |
| Fluosulfonic Acid ($HSO_3F$). | 14–21 | | |

Etchant number 23 was used for etching dielectric layers of polyester material. Etchants used in the practice of this preparation process were developed in connection with the Process for Chemical Drilling of Circuit Boards filed approximately April 1, 1963, having the Serial Number 269,453.

The table below shows experimental data taken from tests using etchant 22 selected from the previous table. Similar tests have been run using other etchants from Table I.

*Table II*

| Test Board No. | Bath Temperature Fahrenheit | Etching Range Time (secs.) | [1] Approximate Speed of Agitation |
|---|---|---|---|
| 1 | 142 | 30– 70 | 66 r.p.m. |
| 2 | 84 | 40– 90 | None. |
| 3 | 98 | 30– 80 | 120 r.p.m. |
| 4 | 127 | 20– 70 | 80 r.p.m. |
| 5 | 130 | 20– 70 | 100 r.p.m. |
| 6 | 142 | 40–120 | 120 r.p.m. |
| 7 | 140 | 50–120 | 130 r.p.m. |
| 8 | 135 | 60–120 | 125 r.p.m. |
| 9 | 144 | 30–100 | 110 r.p.m. |
| 10 | 148 | 20– 60 | 86 r.p.m. |
| 11 | 148 | 20– 60 | 87 r.p.m. |
| 12 | 96 | 60 | 6 ft./min.—Linear. |
| 13 | 97 | 35 | 6 ft./min.—Linear. |
| 14 | 107 | 60 | None. |
| 15 | 126 | 15 | 6 ft./min.—Linear. |
| 16 | 150 | 15 | 6 ft./min.—Linear. |
| 17 | 142 | 15 | 6 ft./min.—Linear. |
| 18 | 136 | 15 | 6 ft./min.—Linear. |
| 19 | 136 | 30 | 6 ft./min.—Linear. |
| 20 | 136 | 60 | 6 ft./min.—Linear. |
| 21 | 136 | 75 | 6 ft./min.—Linear. |
| 22 | 142 | 30 | 6 ft./min.—Linear. |
| 23 | 142 | 60 | 6 ft./min.—Linear. |
| 24 | 142 | 90 | 6 ft./min.—Linear. |

[1] Speed of agitation when using air driven stirrer was determined by visually counting the number of revolutions past a reference point during set intervals.

Finer etching was seen to occur at the higher temperatures. Etching occurs faster with higher temperature and/or higher speed of agitation. Etch time shown in Table II was taken on .0625 inch thickness boards. The time was much reduced when used with 4 to 8 milli inch thickness boards.

Preferred results were obtained by horizontal agitation over a speed range from six to fifteen feet per minute as opposed to rotation type agitation at various speeds. The boards were attached perpendicularly to a mechanical work rod which was moved linearly through etchant by means of a variable speed reciprocating motor. The rod speed was measured by counting the distance the rod moved in one interval of time.

After the boards were etched, as an optional step, copper bonding was electrolytically plated along the inner surface of the holes in the boards. Tests conducted afterwards showed a much improved bonding layer. Other deposition processes have also been used to deposit metal between the interconnectable foil layers.

FIG. 1 contains an illustration of laminate 1 after the etching in layers 3, 5, and 7 have been completed using fluosulfonic etchants described above. Larger areas of exposed copper cladding in layers 2, 4, 6, and 8 are now available whenever plating is deposited on the inside of the hole area. In some instances it might be desirable to press the overhanging layers 2, 4, 6, and 8 to the side of the hole walls. This can be done by pressing the copper layers down either by running a rod through the hole or by pressing with some other metallic instrument.

FIG. 2 is an illustration of a multilayer board with the overhanging pressed to the hole wall. Layers 2, 4, 6, and 8 are pressed against the undercut areas of layers 3, 5, and 7. Layers 2, 4, and 6 when depressed, do not make contact with each other.

SUMMARY

This invention is comprised of the steps of immersing a multilayer circuit board having holes mechanically drilled therethrough at selected locations and having alternately interposed layers of metal and layers of a dielectric material into a heated chemical etchant comprised of $H_2SO_4$ and HF and while immersed in said etchant, agitating the multilayer board at a fixed rate for a fixed length of time. After the board has been etched as required, it is removed and rinsed. The overlapping metal foil layers exposed by the etching are pressed into the hole along the hole walls.

Although the invention has been described and illustrated in detail, it is to be clearly understood that the same is by way of illustration and example only and is not to be taken by way of limitation, the spirit and scope of this invention being limited only by the terms of the appended claim.

We claim:

A process for preparing a multilayer electrical circuit board for depositing electrical connections between layers, said circuit board having a plurality of epoxy-glass dielectric layers and a plurality of interconnectable metal foil layers on either side of said dielectric layers with at least one metal foil layer between epoxy-glass dielectric layers, said circuit board having holes drilled therethrough at predetermined locations, comprising the steps of immerising said multilayer board in an etchant until at least a portion of said interconnectable metal foil layers is exposed, said etchant comprising approximately two parts $H_2SO_4$ having a concentration of from 93–98% and one part HF having a concentration of from 70 to 100% and wherein said etchant is heated to and maintained over a temperature range of from 75 to 150° F., and depositing metal on said exposed portion of said metal foil layers for completing interconnections between layers of said electrical circuit board.

References Cited by the Examiner

UNITED STATES PATENTS

| | | | |
|---|---|---|---|
| 2,337,062 | 12/1943 | Page | 156—18 X |
| 2,411,298 | 11/1946 | Shore | 117—327 |
| 3,186,883 | 6/1965 | Frautzen | 156—7 |

OTHER REFERENCES

Kollmeier: Molded Printed Circuit Thru-Hole Connection, I.B.M. Disclosure, vol. 1, No. 6, April 1959, page 18.

ALEXANDER WYMAN, *Primary Examiner.*

J. STEINBERG, *Assistant Examiner.*